US012782828B2

(12) United States Patent
Manos et al.

(10) Patent No.: US 12,782,828 B2
(45) Date of Patent: Nov. 3, 2026

(54) SYSTEM AND METHOD FOR TARGET CENTERING DETECTION IN OVERLAY METROLOGY

(71) Applicant: KLA Corporation, Milpitas, CA (US)

(72) Inventors: Ofer Manos, Migdal HaEmek (IL); Sveta Grechin, Migdal HaEmek (IL); Ran Trifon, Migdal HaEmek (IL); Yang Yu, Migdal HaEmek (IL); Mohamed Hegaze, Migdal HaEmek (IL); Avner Safrani, Misgav (IL); Ohad Bachar, Timrat (IL)

(73) Assignee: KLA Corporation, Milpitas, CA (US)

( * ) Notice: Subject to any disclaimer, the term of this patent is extended or adjusted under 35 U.S.C. 154(b) by 225 days.

(21) Appl. No.: 18/824,182

(22) Filed: Sep. 4, 2024

(65) Prior Publication Data

US 2026/0064014 A1 Mar. 5, 2026

(51) Int. Cl.

*G03F 7/00* (2006.01)
*G06T 7/00* (2017.01)

(Continued)

(52) U.S. Cl.

CPC ...... *G03F 7/70633* (2013.01); *G03F 7/70525* (2013.01); *G03F 7/70653* (2023.05);

(Continued)

(58) Field of Classification Search

CPC ............ G03F 7/70633; G03F 7/70525; G03F 7/70653; G03F 7/706837; G03F 7/706841;

(Continued)

(56) References Cited

U.S. PATENT DOCUMENTS

| | | | | |
|---|---|---|---|---|
| 11,556,738 | B2 * | 1/2023 | Lavert | G06F 18/40 |
| 2019/0178639 | A1 | 6/2019 | Gutman et al. | |

(Continued)

OTHER PUBLICATIONS

Katz, Shlomit, et al. “Accuracy enhancement in imaging-based overlay metrology by optimizing measurement conditions per layer.” Metrology, Inspection, and Process Control for Semiconductor Manufacturing XXXV. vol. 11611. SPIE, 2021. (Year: 2021) https://www.spiedigitallibrary.org/conference-proceedings-of-spie/11611/116112O/Accuracy-enhancement-in-imaging-based-overlay-metrology-by-optimizing-measurement/10.1117/12.2583615.short (Year: 2021).*

(Continued)

*Primary Examiner* — Han Hoang
(74) *Attorney, Agent, or Firm* — Suiter Swantz IP

(57) ABSTRACT

A system for target centering detection may be configured receive one or more acquisition images of a sample from an overlay metrology sub-system and determine, using a machine learning-based centering model, one or more stage correctables based on the received one or more acquisition images. The system may be configured to cause a sample stage of the overlay metrology sub-system to adjust a stage position based on the determined one or more stage correctables and receive one or more measurement images of the sample from the overlay metrology sub-system based on the adjusted stage position of the sample stage. The system may (Continued)

then be configured to determine one or more overlay measurements based on the received one or more measurement images.

22 Claims, 7 Drawing Sheets

(51) Int. Cl.
*G06V 10/764* (2022.01)
*G06V 10/774* (2022.01)

(52) U.S. Cl.
CPC .. *G03F 7/706837* (2023.05); *G03F 7/706841* (2023.05); *G03F 7/706845* (2023.05); *G03F 7/70775* (2013.01); *G06T 7/001* (2013.01); *G06V 10/764* (2022.01); *G06V 10/774* (2022.01); *G06T 2207/20081* (2013.01); *G06T 2207/30148* (2013.01); *G06V 2201/07* (2022.01)

(58) Field of Classification Search
CPC ........... G03F 7/706845; G03F 7/70775; G06T 7/001; G06T 2207/20081; G06T 2207/30148; G06V 10/764; G06V 10/774; G06V 2201/07
See application file for complete search history.

(56) References Cited

U.S. PATENT DOCUMENTS

| | | | | |
|---|---|---|---|---|
| 2021/0025695 A1 | 1/2021 | Li et al. | | |
| 2022/0412734 A1* | 12/2022 | Pandev | G01B 21/24 | |
| 2023/0258446 A1* | 8/2023 | Moon | G01B 11/24 | 702/155 |
| 2024/0020353 A1 | 1/2024 | Lavert et al. | | |
| 2024/0289940 A1 | 8/2024 | Dubovski et al. | | |
| 2025/0285007 A1 | 9/2025 | Grechin et al. | | |

OTHER PUBLICATIONS

Lee, Hyunchul, et al. "Image-based overlay target design using a grating intersection." Journal of Micro/Nanopatterning, Materials, and Metrology 21.3 (2022): 034801-034801. (Year: 2022) https://www.spiedigitallibrary.org/journals/journal-of-micro-nanopatterning-materials-and-metrology/volume-21/issue-3/034801/Image-based-overlay-target-design-using-a-grating-intersection/10.1117/1.JMM.21.3.034801.short (Year: 2022).*

Ministry of Intellectual Property, International Search Report and Written Opinion received in International Application No. PCT/US2025/042682, Nov. 22, 2025, 7 pages.

U.S. Appl. No. 18/597,581, filed Mar. 6, 2024, Grechin et al.

Alzubaidi et al., "Review of deep learning: concepts, CNN architectures, challenges, applications, future directions," Journal of Big Data, (2021).

Grechin et al., "Artificial intelligence measurement in imaging-based overlay metrology for performance boost," Proc. SPIE 12955, Metrology, Inspection, and Process Control XXXVIII, 129552P (Apr. 9, 2024).

Katz et al., "Accuracy enhancement in imaging-based overlay metrology by optimizing measurement conditions per layer", Proc. SPIE Metrology, Inspection, and Process Control for Semiconductor Manufacturing XXXV; 116112O (2021).

Katz et al., "OPO residuals reduction with imaging metrology color per layer mode", Proc. SPIE 113252, Metrology, Inspection, and Process Control for Microlithography XXXIV, 113252E (2020).

Li et al., "OPO improvements by Moire effect-based imaging", Proc. SPIE 12496, Metrology, Inspection, and Process Control for Microlithography XXXVII, 124960R (2023).

Liu et al., "SSD: Single Shot MultiBox Detector" UNC Chapel Hill, Zoox Inc., Google Inc., University of Michigan, Ann-Arbor, 2016.

* cited by examiner

SYSTEM AND METHOD FOR TARGET CENTERING DETECTION IN OVERLAY METROLOGY

TECHNICAL FIELD

The present disclosure relates generally to overlay metrology and, more particularly, to a system and method for target centering detection in overlay metrology.

BACKGROUND

Overlay metrology generally refers to measurements of the relative alignment of layers on a sample such as, but not limited to, semiconductor devices. An overlay measurement, or a measurement of overlay error, typically refers to a measurement of the misalignment of fabricated features on two or more sample layers. In a general sense, proper alignment of fabricated features on multiple sample layers is necessary for proper functioning of the device.

Demands to decrease feature size and increase feature density are resulting in correspondingly increased demand for accurate and efficient overlay metrology. Metrology systems typically generate metrology data associated with a sample by measuring or otherwise inspecting dedicated metrology targets distributed across the sample. For example, often advanced imaging metrology (AIM) and robust AIM (rAIM) targets are used in imaging-based overlay (IBO) for overlay measurement. The overlay measurement compares the center of mass of the previous and current layers' grating signals. For the measurement to be precise and accurate, the target must be well focused and well centered during the acquisition of the overlay target.

Conventional metrology tools often employ hardware-based focusing mechanisms (e.g., fringe scanning or bi-cell chopper detection) and/or image processing algorithms for target decentering detection. However, such existing methods are slow and require well-focused acquisition images.

As such, it would be advantageous to provide a system and method that cures the shortcomings of the previous approaches identified above.

SUMMARY

A system is disclosed, in accordance with one or more embodiments of the present disclosure. In embodiments, the system includes a controller including one or more processors configured to execute a set of program instructions stored in memory. In embodiments, the set of program instructions are configured to cause the one or more processors to receive one or more acquisition images of a sample from an overlay metrology sub-system. In embodiments, the set of program instructions are configured to cause the one or more processors to determine, using a machine learning-based centering model, one or more stage correctables based on the received one or more acquisition images. In embodiments, the set of program instructions are configured to cause the one or more processors to determine, using the machine learning-based centering model, a model output confidence score, where the model output confidence score indicates a level of confidence associated with a respective stage correctable determined using the machine learning-based centering model. In embodiments, the set of program instructions are configured to cause the one or more processors to generate one or more control signals configured to cause a sample stage of the overlay metrology sub-system to adjust a stage position based on the determined one or more stage correctables. In embodiments, the set of program instructions are configured to cause the one or more processors to receive one or more measurement images of the sample from the overlay metrology sub-system, where the one or more measurement images are acquired by the overlay metrology sub-system based on the adjusted stage position of the sample stage. In embodiments, the set of program instructions are configured to cause the one or more processors to determine one or more overlay measurements based on the received one or more measurement images.

A system is disclosed, in accordance with one or more embodiments of the present disclosure. In embodiments, the system includes an overlay metrology sub-system configured to acquire one or more images of a sample. In embodiments, the system includes a controller communicatively coupled to the overlay metrology sub-system. In embodiments, the controller includes one or more processors configured to execute a set of program instructions stored in memory. In embodiments, the set of program instructions are configured to cause the one or more processors to receive one or more acquisition images of the sample from the overlay metrology sub-system. In embodiments, the set of program instructions are configured to cause the one or more processors to determine, using a machine learning-based centering model, one or more stage correctables based on the received one or more acquisition images. In embodiments, the set of program instructions are configured to cause the one or more processors to determine, using the machine learning-based centering model, a model output confidence score, where the model output confidence score indicates a level of confidence associated with a respective stage correctable determined using the machine learning-based centering model. In embodiments, the set of program instructions are configured to cause the one or more processors to generate one or more control signals configured to cause a sample stage of the overlay metrology sub-system to adjust a stage position based on the determined one or more stage correctables. In embodiments, the set of program instructions are configured to cause the one or more processors to receive one or more measurement images of the sample from the overlay metrology sub-system, where the one or more measurement images are acquired by the overlay metrology sub-system based on the adjusted stage position of the sample stage. In embodiments, the set of program instructions are configured to cause the one or more processors to determine one or more overlay measurements based on the received one or more measurement images.

A method is disclosed, in accordance with one or more embodiments of the present disclosure. In embodiments, the method includes, but is not limited to, receiving one or more acquisition images of a sample from an overlay metrology sub-system. In embodiments, the method includes, but is not limited to, determining, using a machine learning-based centering model, one or more stage correctables based on the received one or more acquisition images. In embodiments, the method includes, but is not limited to, determining, using the machine learning-based centering model, a model output confidence score, where the model output confidence score indicates a level of confidence associated with a respective stage correctable determined using the machine learning-based centering model. In embodiments, the method includes, but is not limited to, generating one or more control signals configured to cause a sample stage of the overlay metrology sub-system to adjust a stage position based on the determined one or more stage correctables. In embodiments, the method includes, but is not limited to, receiving one or more measurement images of the sample from the overlay metrology sub-system, where the one or more measurement images are acquired by the overlay metrology sub-system based on the adjusted stage position of the sample stage. In embodiments, the method includes, but is not limited to, determining one or more overlay measurements based on the received one or more measurement images.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to a system and method for target centering detection in overlay metrology. For example, the system and method may use a machine learning-based centering model configured to generate one or more stage correctables (e.g., Ax, Ay, and the like) and adjust a stage of the overlay metrology sub-system accordingly. In this regard, the overlay metrology target is centered and in-focus when the measurement image is captured by the overlay metrology sub-system. Additionally, the machine learning-based centering model may be configured to output a model confidence score.

It is contemplated herein that the machine learning-based centering model of the present disclosure may eliminate the second move z-focus step required with existing techniques. For example, the system and method of the present disclosure may perform correction of the x-, y-, and z-stages simultaneously using the on-tool processor, where the measurement image is captured following such correction. In this regard, the move-acquire-measure (MAM) time is reduced (e.g., by more than 10 ms) and the accuracy of the overlay measurement is improved since each site is measured in the best contrast focus position.

Referring now to FIGS. 1-6, systems and methods for target centering detection in overlay metrology are described in greater detail in accordance with one or more embodiments of the present disclosure.

Figure 1:
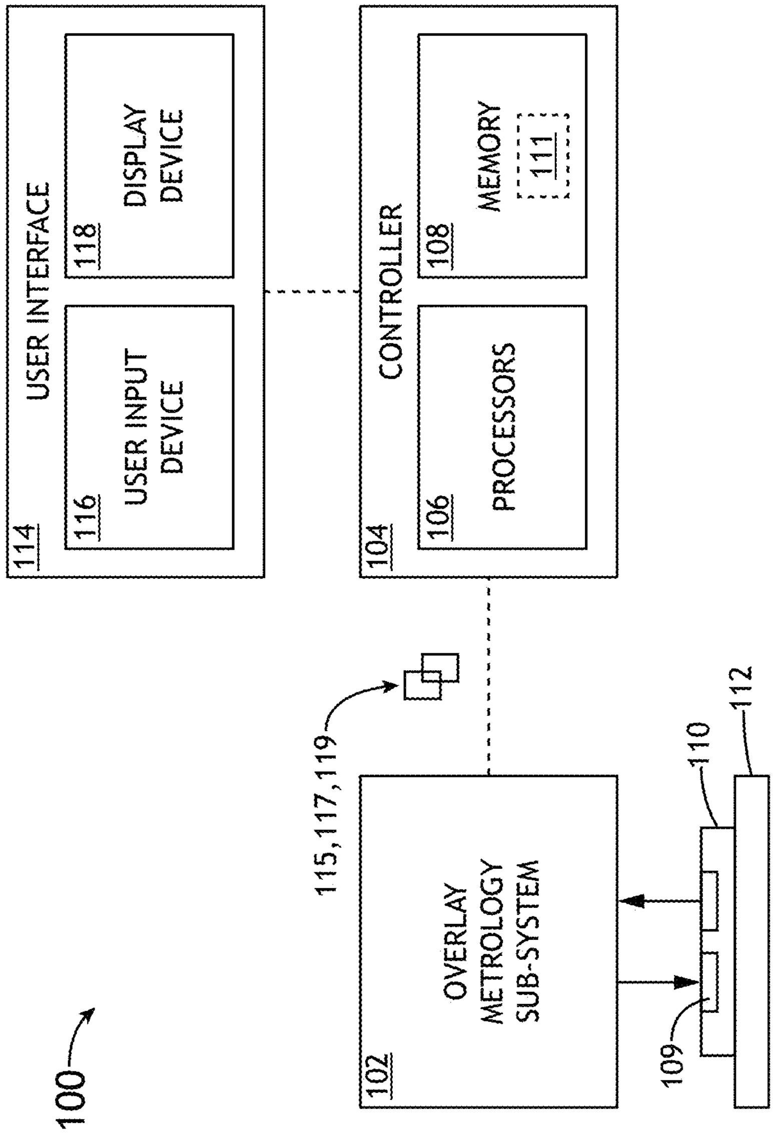
FIG. 1 illustrates a block diagram view of a system for target centering, in accordance with one or more embodiments of the present disclosure.

FIG. 1 illustrates a block diagram view of a system 100 for target centering detection, in accordance with one or more embodiments of the present disclosure. In embodiments, the system 100 includes an overlay metrology sub-system 102 and a controller 104 communicatively coupled to the overlay metrology sub-system 102. The controller 104 may include one or more processors 106 and memory 108. The overlay metrology sub-system 102 may be configured to image one or more overlay targets 109 on a sample 110 secured on a sample stage 112.

The one or more processors 106 of controller 104 may be configured to execute a target centering model 111 configured to perform target centering detection of the one or more overlay targets 109 on the sample 110. For example, the target centering model 111 may be stored in memory 108. It is contemplated herein that the target centering model 111 may include any type of machine learning algorithm/classifier and/or deep learning technique or classifier known in the art including, but not limited to, a conditional generative adversarial network (CGAN), a convolutional neural network (CNN) (e.g., GoogleNet, AlexNet, and the like), an ensemble learning classifier, a random forest classifier, artificial neural network (ANN), and the like.

In embodiments, the one or more processors 106 may be configured to execute a set of program instructions maintained in the memory 108. For example, the one or more processors 106 may be configured to receive one or more training images 115 of the sample 110. By way of another example, the one or more processors 106 may be configured to generate the target centering model 111 based on the received one or more training images 115 of the sample 110. By way of another example, the one or more processors 106 may be configured to receive one or more acquisition images 117 of the sample 110 from the overlay metrology sub-system 102. By way of another example, the one or more processors 106 may be configured to determine, using the target centering model 111, one or more stage correctables based on the received one or more acquisition images 117. By way of another example, the one or more processors 106 may be configured determine, using the target centering model 111, a model output confidence score. By way of another example, the one or more processors 106 may be configured to generate one or more control signals configured to cause the sample stage 112 of the overlay metrology sub-system 102 to adjust a stage position based on the determined one or more stage correctables. By way of another example, the one or more processors 106 may be configured to receive one or more measurement images 119 of the sample from the overlay metrology sub-system. By way of another example, the one or more processors 106 may be configured to determine one or more overlay measurements based on the received one or more measurement images.

In embodiments, the system 100 includes a user interface 114 communicatively coupled to the controller 104. The user interface 114 may include a user input device 116 and a display 118. The user input device 116 of the user interface 114 may be configured to receive one or more input commands from a user, the one or more input commands configured to input data into the system 100 and/or adjust one or more characteristics of the system 100. For example, the user input device 116 may be configured to receive user labels for the training images 115 from the user. For instance, the user may label the plurality of training images 115 with corresponding offers based on a best contrast focus position, where the labeled training image may be used to train the target centering model 111. In this regard, as will be discussed further herein, the target centering model 111 may be a supervised deep learning model (i.e., trained using user-labeled training images). The display of the user interface 114 may be configured to display data of the system 100 to a user.

Figure 2:
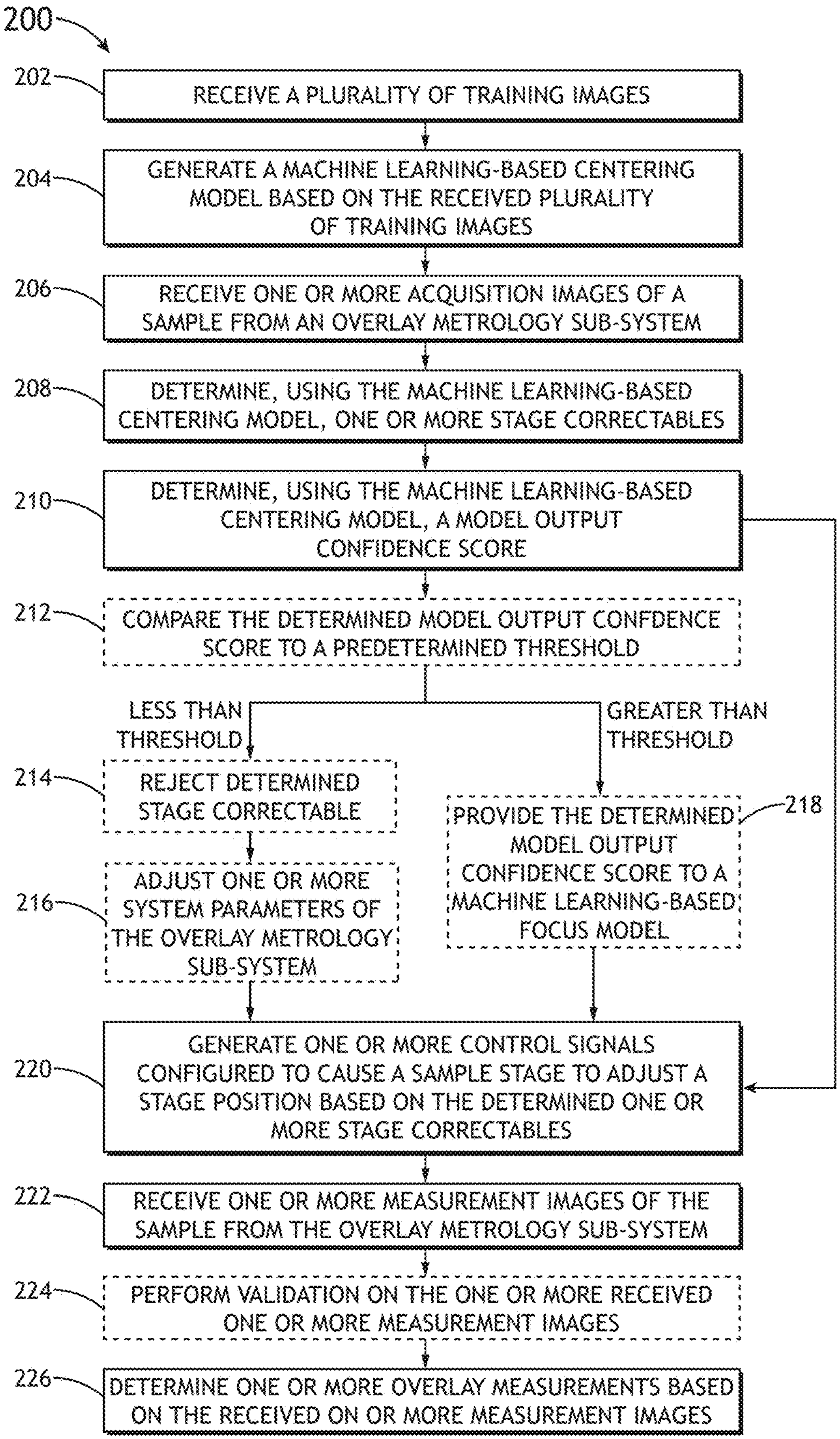
FIG. 2 illustrates a flow diagram illustrating a method for target centering using a machine learning-based centering model, in accordance with one or more embodiments of the present disclosure.
Figure 3A:
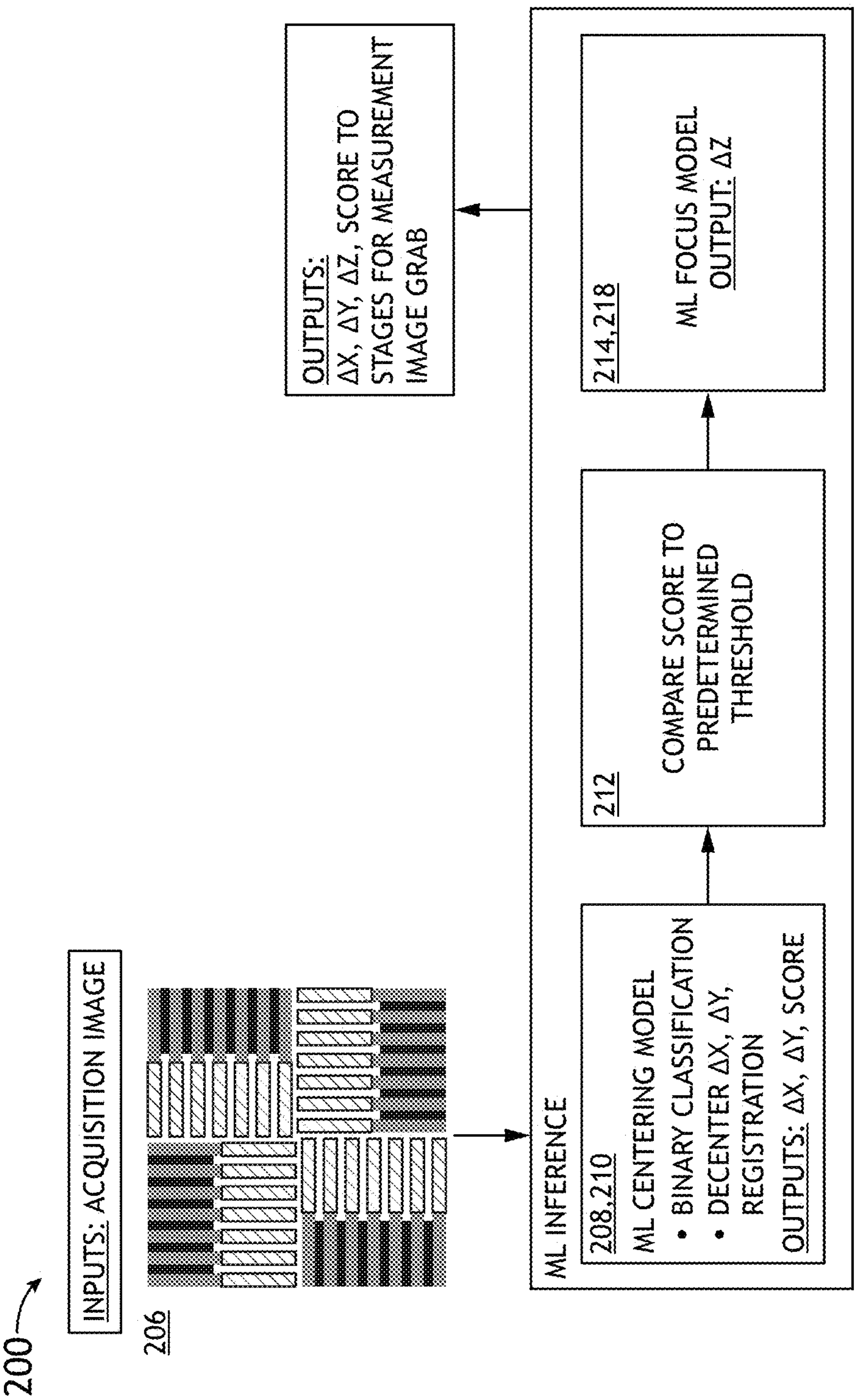
FIG. 3A illustrates a conceptual flow diagram depicting the method for target centering using the machine learning-based centering model, in accordance with one or more embodiments of the present disclosure.
Figure 3B:
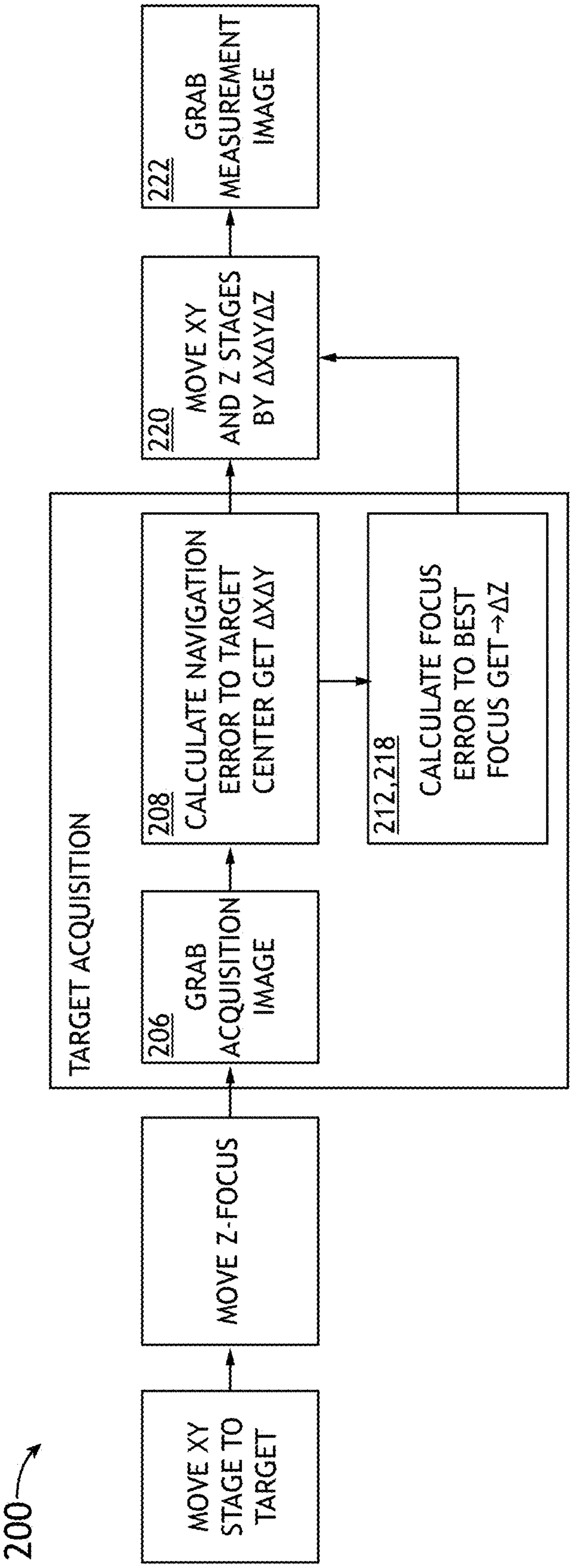
FIG. 3B illustrates a conceptual flow diagram depicting the method for target centering using the machine learning-based centering model, in accordance with one or more embodiments of the present disclosure.

FIG. 2 illustrates a flow diagram depicting a method 200 of machine learning-based target centering, in accordance with one or more embodiments of the present disclosure. FIGS. 3A-3B illustrate conceptual flow diagrams depicting the method 200 of machine learning-based target centering, in accordance with one or more embodiments of the present disclosure. It is noted herein that the embodiments and enabling technologies described previously herein in the context of the system 100 should be interpreted to extend to the method 200. It is further noted, however, that the method 200 is not limited to the architecture of the system 100.

In embodiments, the method 200 includes a step 202 of receiving a plurality of training images. For example, the one or more processors 106 may be configured to receive a plurality of training images 115. In one instance, the one or more processors 106 may be configured to receive the plurality of training images 115 from the overlay metrology sub-system 102. In another instance, the one or more processors 106 may be configured to receive the plurality of training images 115 from a different sub-system communicatively coupled to the one or more processors 106.

The plurality of training images 115 may include a plurality of through-focus images. For example, each through-focus image of the plurality of through-focus images may be labeled with a corresponding offset based on the best contrast focus position. For instance, the initial training images may include through-focus images of a single sample with uniformly spread sites, where for each training site, multiple through-focus images around the best contrast focus are captured. At the end of the through-focus sequence, the best contrast image may be grabbed and set as ground truth for the target centering model 111 (as well as a focusing model, as discussed further herein). In this regard, the target centering model 111 is able to achieve a desired target centering position per site on the sample, thus increasing overall measurement accuracy.

In embodiments, the plurality of training images 115 may be adjusted prior to training the target centering model 111. For example, the plurality of training images 115 may be adjusted based on one or more parameters (or settings) prior to training the target centering model 111 (in step 204).

In embodiments, the method 200 includes a step 204 of generating the machine learning-based centering model based on the received plurality of training images. For example, the one or more processors 106 may be configured to generate the target centering model 111 based on the received plurality of training images 115 (in step 202).

In embodiments, the target centering model 111 may be trained to perform at least coarse training and fine training. For example, during coarse training, the target centering model 111 may be trained to perform object detection with binary classification on image regions. By way of another example, during fine centering training, the target centering model 111 may be trained on the detector part of the model only on the region found during the coarse centering step.

In embodiments, the generated machine learning-based centering model is stored in the memory as a measurement recipe of the overlay metrology sub-system 102. For example, the target centering model 111 may be stored in the measurement recipe and used during the move-focus-grab (MFG) sequence of the overlay metrology sub-system 102.

In embodiments, the method 200 includes a step 206 of receiving one or more acquisition images of a sample from an overlay metrology sub-system. For example, as shown in FIG. 3A, the one or more processors 106 may be configured to receive the acquisition images 117 of the overlay targets 109 on the sample 110 from the overlay metrology sub-system 102.

The one or more acquisition images 117 may include one or more defocused images of the sample 110. For example, the one or more processors 106 may be configured to receive one or more defocused images of the sample 110. In a non-limiting instance, the defocus of the one or more defocused images may be up to ±1.2 μm around the best contrast focus position. In this regard, as discussed further herein, the target centering model 111 may be configured to determine a target centering position of the sample 110 based on one or more defocuses images of the sample 110. As mentioned previously herein, the system 100 is thus able to improve the move-acquire-measure (MAM) time, while also improving overlay measurement accuracy.

In embodiment, the method 200 includes a step 208 of determining, using the machine learning-based centering model, one or more stage correctables based on the received one or more acquisition images 117. For example, the one or more processors 106 may be configured to determine one or more stage correctables based on the received one or more acquisition images 117. The one or more stage correctables may include one or more correctables for the xy-stage. For example, the one or more stage correctables may include at least one of a Δx correctable and a Δy correctable.

In embodiments, the method 200 includes a step 210 of determining, using the machine learning-based centering model, a model output confidence score. For example, the one or more processors 106 may be configured to generate a model output confidence score, where the model output confidence score indicates a level of confidence associated with a respective stage correctable determined using the machine learning-based centering model.

The model output confidence score may be a number be a number between 0 and 1, where a score closer to 1 indicates higher confidence in the model output and a score closer to 0 indicates lower confidence in the model output. For example, a model confidence score may be calculated during binary classification to indicate if the image center is within a predetermined search area (e.g., 120×120 pixel sub-image).

Figure 4:
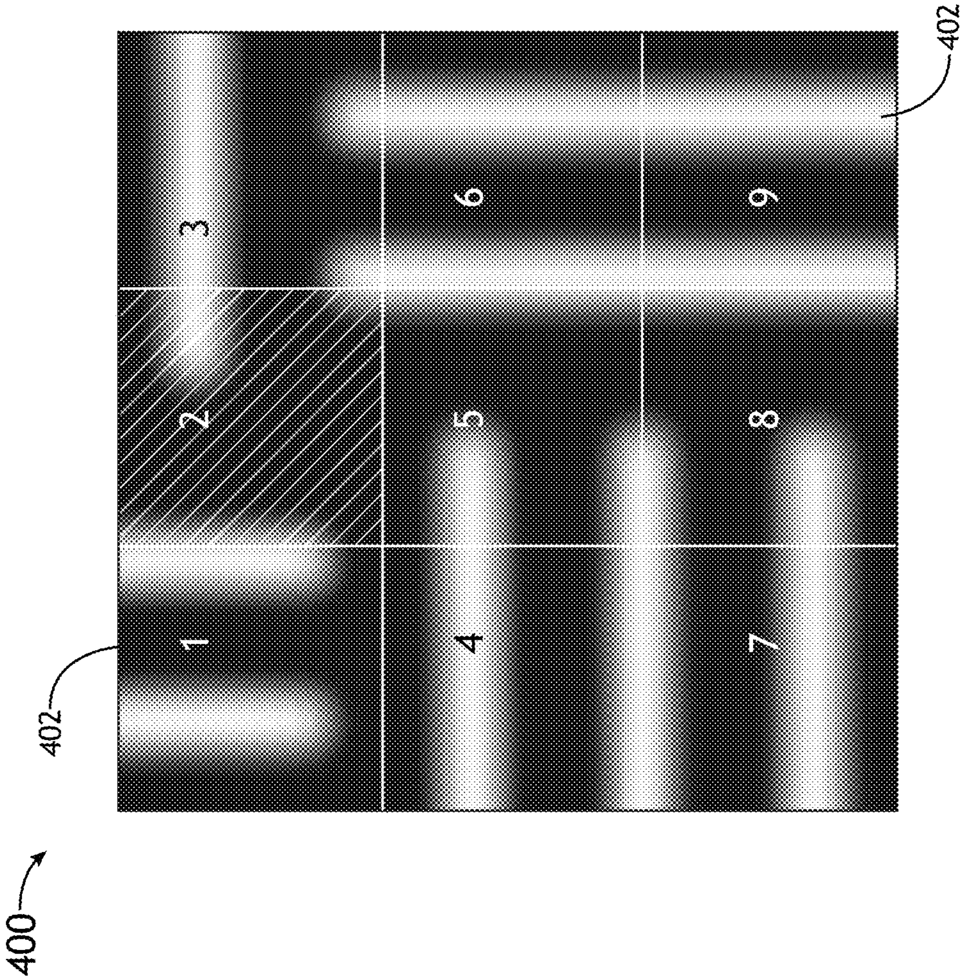
FIG. 4 illustrates a simplified top view of an acquisition image of an overlay target, in accordance with one or more embodiments of the present disclosure.

FIG. 4 illustrates a simplified schematic top view of an acquisition image 400, in accordance with one or more embodiments of the present disclosure.

In embodiments, binary classification may be performed to calculate the model output confidence score, where only the section containing the target center will be associated with a 'high' score. For example, the acquisition images 400 may be separated into one or more image regions 402, where the target centering model 111 may be configured to perform object detection on the respective image regions 402 using binary classification to identify a target center. The target centering model 111 may then perform fine centering on the respective image region where the binary classification identifies the respective target center.

In a non-limiting example, as shown in FIG. 4, the target acquisition image 400 may be divided into nine regions 402. Continuing with this example, section #2 may have a high model confidence output score, and thus be associated with the target center. In this regard, fine centering may be done on only this section (e.g., section #2).

In embodiments, the method 200 includes an optional step 212 of comparing the model output confidence score to one or more predetermined thresholds (e.g., user-defined thresholds, or the like). For example, the one or more processors 106 may be configured to compare the model output confidence score to the one or more predetermined thresholds. For instance, the one or more processors 106 may be configured to receive one or more predetermined thresholds from one or more users and compare the model output confidence score to the user-defined threshold.

In a non-limiting example, the predetermined threshold may be 0.7, where a model output confidence score above 0.7 indicates the image is 'good' and a model output confidence score below 0.7 indicates the image is 'bad' (or rejected).

If the model output confidence score is below the predetermined threshold, the one or more processors 106 may be configured to fail the measurement in an optional step 214. For example, the one or more processors 106 may be configured to reject the determined stage corrections (from step 210).

It is contemplated that a low model output confidence score may be associated with the image center not being within the search area due to incorrect stage navigation. In this case, the model output confidence score may be close to 0. Further, it is contemplated that a low model confidence score may be associated with the input image being strong defocused (e.g., above 1.5-2 μm). In this case, the model output confidence score may be below 0.7.

Upon failing the measurement, in embodiments, the method 200 may include an optional step 216 of adjusting one or more system parameters of the overlay metrology sub-system 102 and capturing one or more additional acquisition images based on the adjusted one or more system parameters. For example, the one or more processors 106 may be configured to adjust one or more system parameters of the overlay metrology sub-system 102 (or other sub-system) and thereafter cause the overlay metrology sub-system 102 to re-capture the acquisition images. In this regard, the model output confidence score may be used to identify system hardware issues and/or issues with the sample itself. In some instances, the model output confidence score may be used to re-train and/or adjust the target centering model 111.

If the model output confidence score is above (or equal to) the predetermined threshold, the one or more processors 106 may be configured to provide the one or more stage correctables (determined in step 208) to a machine learning-based focus model in a step 218. For instance, the Δx correctable and a Δy correctable may be provided to a machine learning-based focus model, where the Δx, Δy correctables may be used to determine a region of interest (ROI) placement. In this regard, the ROI placement may be used for machine learning-based focus model input signals.

The machine learning-based focus model may generally be discussed in U.S. Pat. No. 11,556,738, issued on Jan. 17, 2023, which is incorporated herein by reference in the entirety.

In embodiments, the method 200 includes a step 220 of generating one or more control signals configured to cause a sample stage of the overlay metrology sub-system to adjust a stage position based on the determined one or more stage correctables. For example, the one or more processors 106 may be configured to generate one or more control signals configured to cause the overlay metrology sub-system 102 to adjust the stage position of the sample stage 112 based on the one or more stage correctables (e.g., Δx, Δy). In this regard, the xy-stage may be adjusted by Δx, Δy, such that a correct target centering position is achieved prior to capture of the measurement image (received in step 222).

Where the focus model receives the output of the target centering model 111 from the optional step 218, the method 200 may include simultaneously adjusting a focus of the overlay metrology sub-system while adjusting the stage position of the overlay metrology sub-system (in step 220). For example, the one or more processors 106 may be configured to generate one or more control signals configured to cause the overlay metrology sub-system 102 to simultaneously adjust the xy-stage and z-stage based on the focus (e.g., Δz) and stage correctables (e.g., Δx, Δy). In this regard, the xy-stage may be adjusted by Δx, Δy and the z-stage may be adjust by Δz, such that a correct target centering position and focus is achieved prior to capture of the measurement image (received in step 222).

In embodiments, the method 200 includes a step 222 of receiving one or more measurement images of the sample from the overlay metrology sub-system. For example, the one or more processors 106 may be configured to receive one or more measurement images 119 of the sample 110 from the overlay metrology sub-system 102, where the measurement images are acquired based on the adjusted stage position (and in some instances, focus position) of the sample stage 112.

In an optional step 224, validation may be performed on the received one or more measurement images. For example, the one or more processors 106 may be configured to perform legacy validation on the received one or more measurement images from the overlay metrology sub-system 102, where the measurement images were captured based on the determined stage correctables.

Figure 5B:
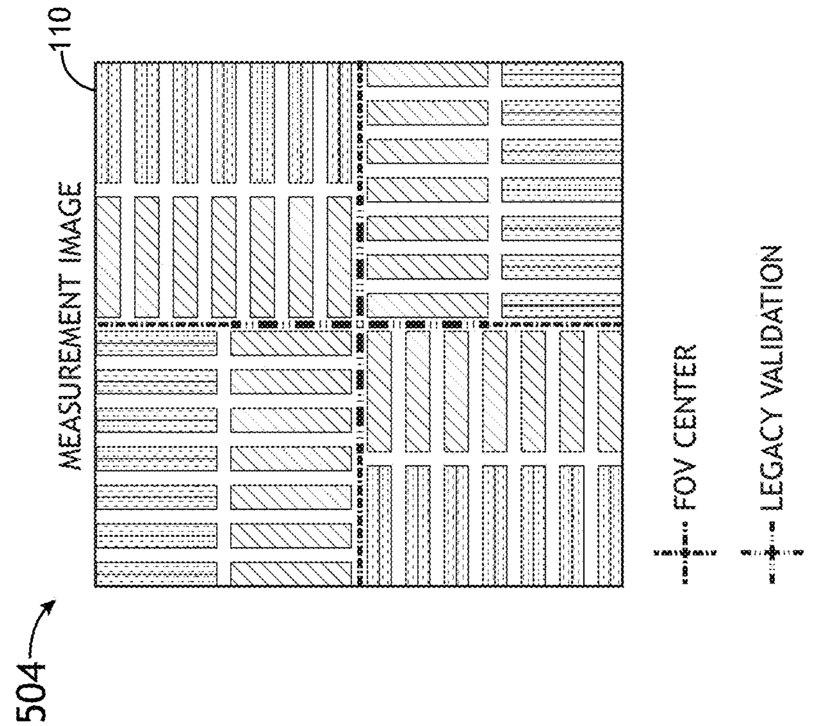
FIG. 5B illustrates a simplified top view of a measurement image of the overlay target, in accordance with one or more embodiments of the present disclosure.
Figure 5A:
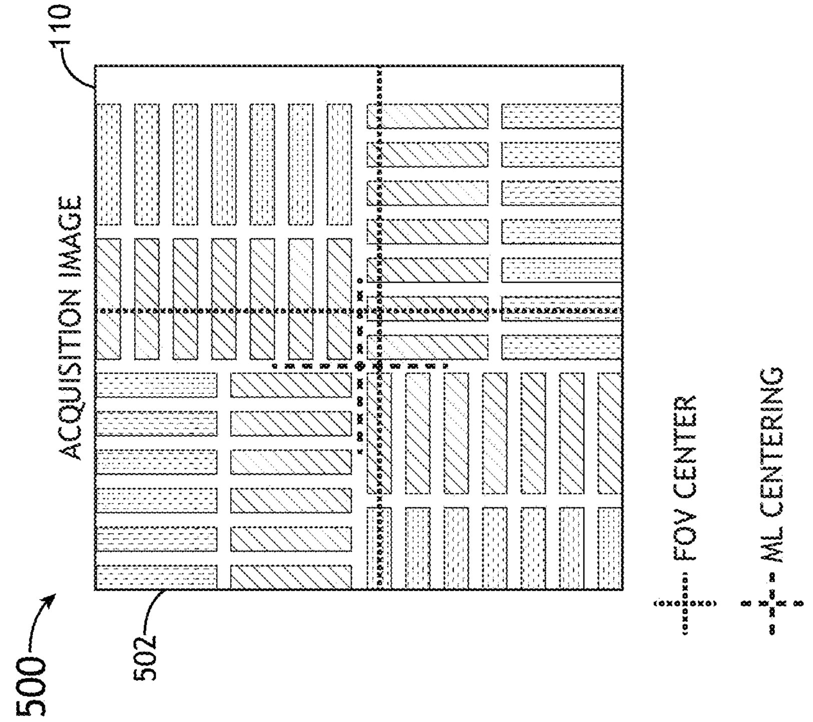
FIG. 5A illustrates a simplified top view of an acquisition image of an overlay target, in accordance with one or more embodiments of the present disclosure.

FIG. 5A illustrates a simplified schematic top view of an acquisition image 500 of an overlay target 502 on the sample 110, in accordance with one or more embodiments of the present disclosure. FIG. 5B illustrates a simplified schematic top view of a measurement image 504 of the overlay target 502 on the sample 110, in accordance with one or more embodiments of the present disclosure.

In embodiments, the measurement images acquired using the system 100 may be compared to images acquired using a different system 100. For example, validation may be performed using a standard legacy acquisition algorithm, where a legacy center is determined.

For example, a Euclidean off-center distance between a measurement image FOV (i.e., target center based on the target centering model 111) in the image 500 and a center calculated on measurement image 504 with legacy acquisition algorithm may be determined, as shown and described by Equations 1.1-1.2 and 2.1-2.2 below:

$$(X_{c\_acq\_legacy}, Y_{c\_acq\_legacy}) \quad \text{Eq. 1.1}$$

$$(X_{c\_meas}, Y_{c\_meas}): \quad \text{Eq. 1.2}$$

$$\Delta X_{cent\_error} = |X_{c\_meas} - X_{c\_acq\_legacy}| \quad \text{Eq. 2.1}$$

$$\Delta Y_{cent\_error} = |Y_{c\_meas} - Y_{c\_acq\_legacy}| \quad \text{Eq. 2.2}$$

If the Euclidean off-center distance exceeds a predefined threshold (e.g., 3 pixels), as shown by Equation xxx, overlay calculations for the respective site should be skipped and remeasured later since overlay calculations may not be reliable.

$$\sqrt{\Delta X^2_{cent\_error} + \Delta Y^2_{cent\_error}} \leq 3 \text{ pixels}$$

It is contemplated that validation may be done after the measurement image is captured (or grabbed) during next site measurement to avoid validation affecting MAM time.

In embodiments, the method 200 includes a step 226 of determining one or more overlay measurements based on the received one or more measurement images. For example, the one or more processors 106 may be configured to determine overlay based on the received measurement images from step 222.

Figure 6:
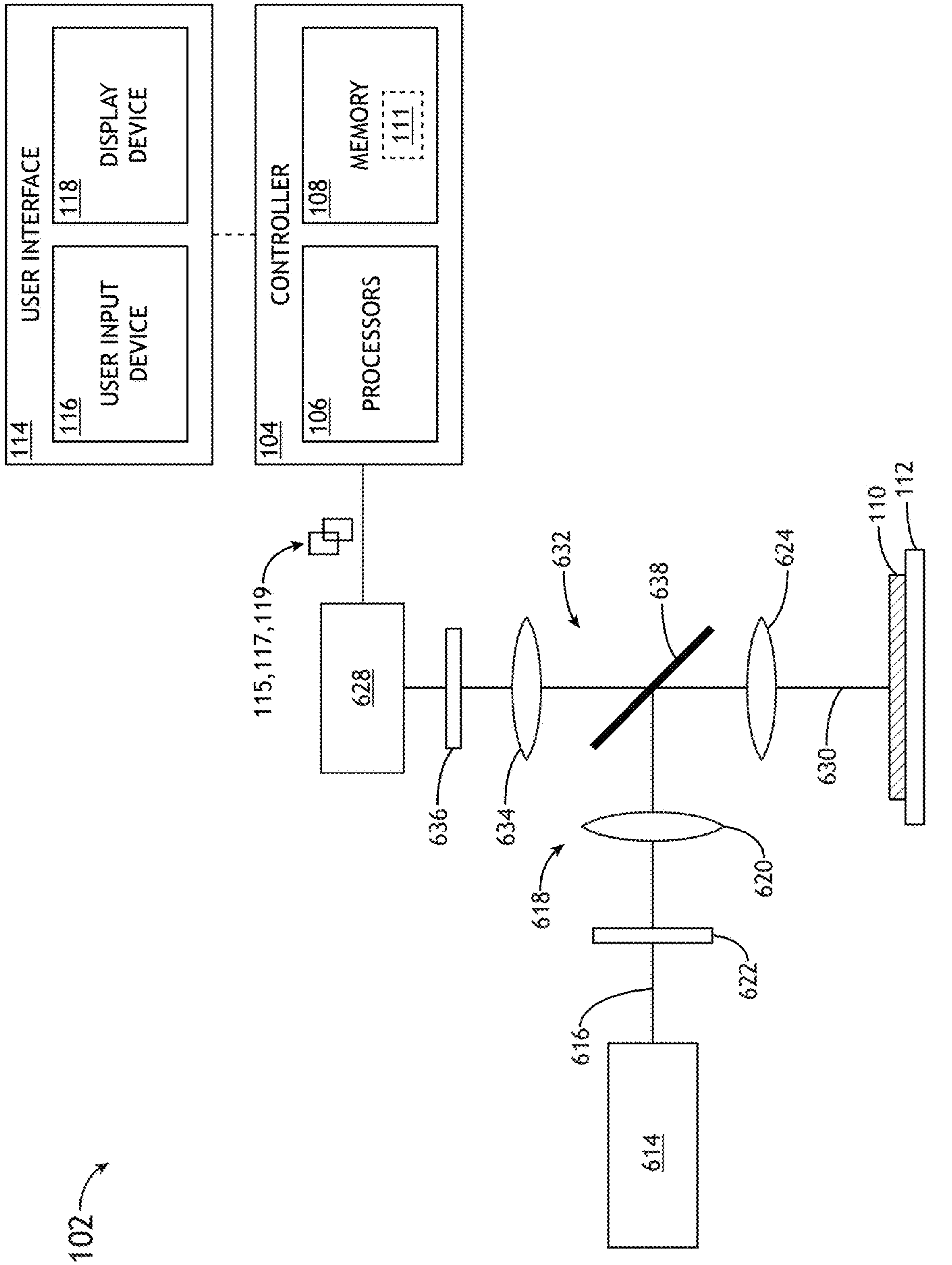
FIG. 6 illustrates a simplified schematic view of an overlay metrology sub-system of the system for target centering, in accordance with one or more embodiments of the present disclosure.

FIG. 6 is a conceptual view of an overlay metrology system 100 for performing overlay metrology on an overlay target using the overlay metrology sub-system 102, in accordance with one or more embodiments of the present disclosure.

It is noted herein that for the purposes of the present disclosure, the term "overlay" is generally used to describe relative positions of features on a sample fabricated by two or more lithographic patterning steps, where the term "overlay error" describes a deviation of the features from a nominal arrangement. In this context, an overlay measurement may be expressed as either a measurement of the relative positions or of an overlay error associated with these relative positions. For example, a multi-layered device may include features patterned on multiple sample layers using different lithography steps for each layer, where the alignment of features between layers must typically be tightly controlled to ensure proper performance of the resulting device. Accordingly, an overlay measurement may characterize the relative positions of features on two or more of the sample layers. By way of another example, multiple lithography steps may be used to fabricate features on a single sample layer. Such techniques, commonly called double-patterning or multiple-patterning techniques, may facilitate the fabrication of highly dense features near the resolution of the lithography system. An overlay measurement in this context may characterize the relative positions of the features from the different lithographic steps on this single layer. It is to be understood that examples and illustrations throughout the present disclosure relating to a particular application of overlay metrology are provided for illustrative purposes only and should not be interpreted as limiting the disclosure.

As used throughout the present disclosure, the term "sample" generally refers to a substrate formed of a semiconductor or non-semiconductor material (e.g., a wafer, or the like). For example, a semiconductor or non-semiconductor material may include, but is not limited to, monocrystalline silicon, gallium arsenide, and indium phosphide. A sample may include one or more layers. For example, such layers may include, but are not limited to, a resist, a dielectric material, a conductive material, and a semiconductive material. Many different types of such layers are known in the art, and the term sample as used herein is intended to encompass a sample on which all types of such layers may be formed. One or more layers formed on a sample may be patterned or unpatterned. For example, a sample may include a plurality of dies, each having repeatable patterned features. Formation and processing of such layers of material may ultimately result in completed devices. Many different types of devices may be formed on a sample, and the term sample as used herein is intended to encompass a sample on which any type of device known in the art is being fabricated. Further, for the purposes of the present disclosure, the term sample and wafer should be interpreted as interchangeable. In addition, for the purposes of the present disclosure, the terms patterning device, mask and reticle should be interpreted as interchangeable.

The overlay target 109 may generally include any overlay target known in the art including, but not limited to, an advanced imaging metrology (AIM) target, a robust AIM target, or a triple AIM target.

In embodiments, the system 100 includes the overlay metrology sub-system 102 to acquire images of the sample 110 based on any number of overlay recipes. For example, the overlay metrology sub-system 102 may direct illumination to the sample 110 and may further collect light or other radiation emanating from the sample 110 to generate an overlay signal suitable for the determination of overlay of two or more sample layers. The overlay metrology sub-system 102 may be any type of overlay metrology sub-system known in the art suitable for generating overlay signals suitable for determining overlay associated with overlay targets 109 on the sample 110. For example, the 102//may include an image-based overlay metrology sub-system 102. The overlay metrology sub-system 102 may selectively operate in an imaging mode or a non-imaging mode.

The overlay metrology sub-system 102 may be configurable to generate overlay signals based on any number of recipes defining measurement parameters for acquiring an overlay signal suitable for determining overlay of an overlay target 109. For example, a recipe of the overlay metrology sub-system 102 may include, but is not limited to, an illumination wavelength, a detected wavelength of light emanating from the sample 110, a spot size or shape of illumination on the sample 110, an angle of incident illumination, a polarization of incident illumination, a polarization of collected light, a position of a beam of incident illumination on an overlay target 109, a center position of an overlay target 109 in the focal volume of the overlay metrology sub-system 102, or the like.

In embodiments, the overlay metrology sub-system 102 includes an illumination sub-system including an illumination source 614 configured to generate at least one illumination beam 616 and one or more illumination optics 622. For example, the illumination sub-system may include one or more broadband illumination sources 614 configured to generate one or more broadband illumination beams 616. In this regard, the overlay metrology sub-system 102 may include one or more apertures at an illumination pupil plane to divide illumination from the illumination source 614 into one or more illumination beams 616 or illumination lobes. In this regard, the overlay metrology sub-system 102 may provide dipole illumination, quadrature illumination, or the like. Further, the spatial profile of the one or more illumination beams 616 on the sample 110 may be controlled by a field-plane stop to have any selected spatial profile.

The illumination source 614 may include any type of illumination source suitable for providing at least one broadband illumination beam 616. In embodiments, the illumination source 614 is a laser source. For example, the illumination source 614 may include a broadband laser source.

In embodiments, the overlay metrology sub-system 102 directs the illumination beam 616 to the sample 110 via an illumination pathway 618. The illumination pathway 618 may include one or more optical components suitable for modifying and/or conditioning the illumination beam 616 as well as directing the illumination beam 616 to the sample 110. In embodiments, the illumination pathway 618 includes one or more illumination-pathway lenses 620 (e.g., to collimate the illumination beam 616, to relay pupil and/or field planes, or the like). In embodiments, the illumination pathway 618 includes one or more illumination-pathway optics 622 to shape or otherwise control the illumination beam 616. For example, the illumination-pathway optics 622 may include, but are not limited to, one or more field stops, one or more pupil stops, one or more polarizers, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

In embodiments, the overlay metrology sub-system 102 includes an objective lens 624 to focus the illumination beam 616 onto the sample 110 (e.g., an overlay target 109 with overlay target features located on two or more layers of the sample 110). In embodiments, the sample 110 is disposed on a sample stage 112 suitable for securing the sample 110 and further configured to position the sample 110 with respect to the illumination beam 616.

In embodiments, the overlay metrology sub-system 102 includes one or more detectors 628 configured to capture light emanating from the sample 110 (e.g., an overlay target 109 on the sample 110) (e.g., collected light 630) through a collection pathway 632. The collection pathway 632 may include one or more optical elements suitable for modifying and/or conditioning the collected light 630 from the sample 110. In embodiments, the collection pathway 632 includes one or more collection-pathway lenses 634 (e.g., to collimate the illumination beam 616, to relay pupil and/or field planes, or the like), which may include, but is not required to include, the objective lens 624. In embodiments, the collection pathway 632 includes one or more collection-pathway optics 636 to shape or otherwise control the collected light 630. For example, the collection-pathway optics 636 may include, but are not limited to, one or more field stops, one or more pupil stops, one or more polarizers, one or more filters, one or more beams splitters, one or more diffusers, one or more homogenizers, one or more apodizers, one or more beam shapers, or one or more mirrors (e.g., static mirrors, translatable mirrors, scanning mirrors, or the like).

The overlay metrology sub-system 102 may generally include any number or type of detectors 628 suitable for capturing light from the sample 110 indicative of overlay. In embodiments, the detector 628 includes one or more detectors 628 suitable for characterizing a static sample. In this regard, the overlay metrology sub-system 102 may operate in a static mode in which the sample 110 is static during a measurement. For example, a detector 628 may include a two-dimensional pixel array such as, but not limited to, a charge-coupled device (CCD) or a complementary metal-oxide semiconductor (CMOS) device. In this regard, the detector 628 may generate a two-dimensional image in a single measurement.

In embodiments, the detector 628 includes one or more detectors 628 suitable for characterizing a moving sample 110 (e.g., a scanned sample). In this regard, the overlay metrology sub-system 102 may operate in a scanning mode in which the sample 110 is scanned with respect to a measurement field during a measurement. For example, the detector 628 may include a 2D pixel array with a capture time and/or a refresh rate sufficient to capture one or more images during a scan within selected image tolerances (e.g., image blur, contrast, sharpness, or the like). By way of another example, the detector 628 may include a line-scan detector to continuously generate an image one line of pixels at a time. By way of another example, the detector 628 may include a time-delay integration (TDI) detector. A TDI detector may generate a continuous image of the sample 110 when the motion of the sample 110 is synchronized to charge-transfer clock signals in the TDI detector. In particular, a TDI detector acquires charge from light exposure on columns of pixels and includes clock pulses to transfer charge between adjacent columns of pixels along a scan direction. When the motion of the sample 110 along the scan direction is synchronized to the charge transfer in the TDI detector, charge continuously accumulates during the scan. This process continues until the charge reaches a final column of pixels and is subsequently read out of the detector. In this way, images of the object are accumulated over a longer time frame than would be possible with a simple line scan camera. This relatively longer acquisition time decreases the photon noise level in the image. Further, synchronous motion of the image and charge prevents blurring in the recorded image.

In embodiments, the overlay metrology sub-system 102 includes a scanning sub-system to scan the sample 110 with respect to the measurement field during a metrology measurement. For example, the sample stage 112 may position and orient the sample 110 within a focal volume of the objective lens 624. In embodiments, the sample stage 112 includes one or more adjustable stages such as, but not limited to, a linear translation stage, a rotational stage, or a tip/tilt stage. In embodiments, though not shown, the scanning sub-system includes one or more beam-scanning optics (e.g., rotatable mirrors, galvanometers, or the like) to scan the illumination beams 616 with respect to the sample 110).

The illumination pathway 618 and the collection pathway 632 of the overlay metrology sub-system 102 may be oriented in a wide range of configurations suitable for illuminating the sample 110 with the illumination beams 616 and collecting light emanating from the sample 110 in response to the incident illumination beams 616. For example, the overlay metrology sub-system 102 may include a beamsplitter 638 oriented such that a common objective lens 624 may simultaneously direct the illumination beams 616 to the sample 110 and collect light from the sample 110. By way of another example, the illumination pathway 618 and the collection pathway 632 may contain non-overlapping optical paths.

In embodiments, the overlay metrology sub-system 102 may provide overlay data to one or more process sub-systems. Overlay data from an overlay metrology sub-system may generally include any output of an overlay metrology sub-system having sufficient information to determine overlay (or overlay errors) associated with various lithography steps. For example, overlay data may include, but is not required to include, one or more datasets, one or more images, one or more detector readings, or the like. This overlay data may then be used for various purposes including, but not limited to, diagnostic information of the lithography sub-systems or for the generation of process-control correctables. For instance, overlay data for samples in a lot may be used to generate feedback correctables for controlling the lithographic exposure of subsequent samples in the same lot. In another instance, overlay data for samples in a lot may be used to generate feed-forward correctables for controlling lithographic exposures for the same or similar samples in subsequent lithography steps to account for any deviations in the current exposure.

Referring again to FIG. 1, additional components of the system 100 are described in greater detail in accordance with one or more embodiments of the present disclosure.

The one or more processors 106 of the controller 104 may generally include any processor or processing element known in the art. For the purposes of the present disclosure, the term "processor" or "processing element" may be broadly defined to encompass any device having one or more processing or logic elements (e.g., one or more microprocessor devices, one or more application specific integrated circuit (ASIC) devices, one or more field programmable gate arrays (FPGAs), or one or more digital signal processors (DSPs)). In this sense, the one or more processors 106 may include any device configured to execute algorithms and/or instructions (e.g., program instructions stored in memory). In one embodiment, the one or more processors 106 may be embodied as a desktop computer, mainframe computer system, workstation, image computer, parallel processor, networked computer, or any other computer system configured to execute a program configured to operate or operate in conjunction with the system 100, as described throughout the present disclosure. Moreover, different subsystems of the system 100 may include a processor or logic elements suitable for carrying out at least a portion of the steps described in the present disclosure. Therefore, the above description should not be interpreted as a limitation on the embodiments of the present disclosure but merely as an illustration. Further, the steps described throughout the present disclosure may be carried out by a single controller or, alternatively, multiple controllers. Additionally, the controller 104 may include one or more controllers housed in a common housing or within multiple housings. In this way, any controller or combination of controllers may be separately packaged as a module suitable for integration into metrology system 100. Further, the controller 104 may analyze or otherwise process data received from the overlay metrology sub-system 102 and feed the data to additional components within the system 100 or external to the system 100.

Further, the memory device 108 may include any storage medium known in the art suitable for storing program instructions executable by the associated one or more processors 106. For example, the memory device 108 may include a non-transitory memory medium. As an additional example, the memory device 108 may include, but is not limited to, a read-only memory, a random-access memory, a magnetic or optical memory device (e.g., disk), a magnetic tape, a solid-state drive and the like. It is further noted that memory device 108 may be housed in a common controller housing with the one or more processors 106.

In this regard, the controller 104 may execute any of various processing steps associated with metrology and/or inspection. For example, the controller 104 may be configured to generate control signals to direct or otherwise control the overlay metrology sub-system 102, or any components thereof. For instance, the controller 104 may be configured to direct the stage 112 to translate the sample 110 along one or more measurement paths or swaths. By way of another example, the controller 104 may be configured to receive images from the overlay metrology sub-system 102. By way of another example, the controller 104 may generate correctables for one or more additional fabrication sub-systems as feedback and/or feed-forward control of the one or more additional fabrication tools (e.g., lithography tool) based on measurements from the overlay metrology sub-system 102.

One skilled in the art will recognize that the herein described components (e.g., operations), devices, objects, and the discussion accompanying them are used as examples for the sake of conceptual clarity and that various configuration modifications are contemplated. Consequently, as used herein, the specific exemplars set forth and the accompanying discussion are intended to be representative of their more general classes. In general, use of any specific exemplar is intended to be representative of its class, and the non-inclusion of specific components (e.g., operations), devices, and objects should not be taken as limiting.

Those having skill in the art will appreciate that there are various vehicles by which processes and/or systems and/or other technologies described herein can be implemented (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; alternatively, if flexibility is paramount, the implementer may opt for a mainly software implementation; or, yet again alternatively, the implementer may opt for some combination of hardware, software, and/or firmware. Hence, there are several possible vehicles by which the processes and/or devices and/or other technologies described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary.

The previous description is presented to enable one of ordinary skill in the art to make and use the invention as provided in the context of a particular application and its requirements. As used herein, directional terms such as "top," "bottom," "over," "under," "upper," "upward," "lower," "down," and "downward" are intended to provide relative positions for purposes of description, and are not intended to designate an absolute frame of reference. Various modifications to the described embodiments will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

With respect to the use of substantially any plural and/or singular terms herein, those having skill in the art can translate from the plural to the singular and/or from the singular to the plural as is appropriate to the context and/or application. The various singular/plural permutations are not expressly set forth herein for sake of clarity.

All of the methods described herein may include storing results of one or more steps of the method embodiments in memory. The results may include any of the results described herein and may be stored in any manner known in the art. The memory may include any memory described herein or any other suitable storage medium known in the art. After the results have been stored, the results can be accessed in the memory and used by any of the method or system embodiments described herein, formatted for display to a user, used by another software module, method, or system, and the like. Furthermore, the results may be stored "permanently," "semi-permanently," temporarily," or for some period of time. For example, the memory may be random access memory (RAM), and the results may not necessarily persist indefinitely in the memory.

It is further contemplated that each of the embodiments of the method described above may include any other step(s) of any other method(s) described herein. In addition, each of the embodiments of the method described above may be performed by any of the systems described herein.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include but are not limited to physically mateable and/or physically interacting components and/or wirelessly interactable and/or wirelessly interacting components and/or logically interacting and/or logically interactable components.

Furthermore, it is to be understood that the invention is defined by the appended claims. It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," and the like). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, and the like" is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, and the like). In those instances where a convention analogous to "at least one of A, B, or C, and the like" is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, and the like). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A system, the system comprising:

a controller including one or more processors configured to execute a set of program instructions stored in memory, the set of program instructions configured to cause the one or more processors to:

receive one or more acquisition images of a sample from an overlay metrology sub-system;

determine, using a machine learning-based centering model, one or more stage correctables based on the received one or more acquisition images;

determine, using the machine learning-based centering model, a model output confidence score, wherein the model output confidence score indicates a level of confidence associated with a respective stage correctable determined using the machine learning-based centering model;

generate one or more control signals configured to cause a sample stage of the overlay metrology sub-system to adjust a stage position based on the determined one or more stage correctables;

receive one or more measurement images of the sample from the overlay metrology sub-system, wherein the one or more measurement images are acquired by the overlay metrology sub-system based on the adjusted stage position of the sample stage; and determine one or more overlay measurements based on the received one or more measurement images.

2. The system of claim 1, wherein the set of program instructions further configured to cause the one or more processors to:

receive a plurality of training images, wherein the plurality of training images include a plurality of through-focus images; and generate the machine learning-based centering model based on the received plurality of training images.

3. The system of claim 2, wherein the generated machine learning-based centering model is stored in the memory as a measurement recipe of the overlay metrology sub-system.

4. The system of claim 2, wherein each through-focus image of the plurality of through-focus images is labeled with a corresponding offset based on a best contrast focus position.

5. The system of claim 2, wherein the machine learning-based centering model is trained to perform target centering detection based on binary classification of one or more image regions of the plurality of through-focus images.

6. The system of claim 5, wherein a detector part of the machine learning-based centering model is trained based on the one or more image regions of the plurality of through-focus images determined based on the binary classification.

7. The system of claim 1, wherein the one or more acquisition images include one or more defocused images.

8. The system of claim 1, wherein the set of program instructions are further configured to cause the one or more processors to:

provide the determined model output confidence score to a machine learning-based focus model; and simultaneously adjust a focus of the overlay metrology sub-system while adjusting the stage position of the overlay metrology sub-system.

9. The system of claim 1, wherein the set of program instructions are further configured to cause the one or more processors to:

compare the determined model output confidence score to a predetermined threshold.

10. The system of claim 9, wherein the set of program instructions are further configured to cause the one or more processors to:

upon determining the determined model output confidence score is below the predetermined threshold, adjust one or more system parameters of the overlay metrology sub-system; and direct the overlay metrology sub-system to capture one or more additional acquisition images based on the adjusted one or more system parameters.

11. A system, the system comprising:

an overlay metrology sub-system configured to acquire one or more images of a sample; and a controller communicatively coupled to the overlay metrology sub-system, the controller includes one or more processors configured to execute a set of program instructions stored in memory, the set of program instructions configured to cause the one or more processors to:

receive one or more acquisition images of the sample from the overlay metrology sub-system;

determine, using a machine learning-based centering model, one or more stage correctables based on the received one or more acquisition images;

determine, using the machine learning-based centering model, a model output confidence score, wherein the model output confidence score indicates a level of confidence associated with a respective stage correctable determined using the machine learning-based centering model;

generate one or more control signals configured to cause a sample stage of the overlay metrology sub-system to adjust a stage position based on the determined one or more stage correctables;

receive one or more measurement images of the sample from the overlay metrology sub-system, wherein the one or more measurement images are acquired by the overlay metrology sub-system based on the adjusted stage position of the sample stage; and determine one or more overlay measurements based on the received one or more measurement images.

12. The system of claim 11, wherein the set of program instructions further configured to cause the one or more processors to:

receive a plurality of training images, wherein the plurality of training images include a plurality of through-focus images; and generate the machine learning-based centering model based on the received plurality of training images.

13. The system of claim 12, wherein the generated machine learning-based centering model is stored in the memory as a measurement recipe of the overlay metrology sub-system.

14. The system of claim 12, wherein each through-focus image of the plurality of through-focus images is labeled with a corresponding offset based on a best contrast focus position.

15. The system of claim 12, wherein the machine learning-based model is trained to perform target detection based on binary classification of one or more image regions of the plurality of through-focus images.

16. The system of claim 15, wherein a detector part of the machine learning-based model is trained based on the one or more image regions of the plurality of through-focus images determined based on the binary classification.

17. The system of claim 11, wherein the one or more acquisition images include one or more defocused images.

18. The system of claim 11, wherein the set of program instructions are further configured to cause the one or more processors to:

provide the determined model output confidence score to a machine learning-based focus model; and simultaneously adjust a focus of the overlay metrology sub-system while adjusting the stage position of the overlay metrology sub-system.

19. The system of claim 11, wherein the set of program instructions are further configured to cause the one or more processors to:

compare the determined model output confidence score to a predetermined threshold.

20. The system of claim 19, wherein the set of program instructions are further configured to cause the one or more processors to:

upon determining the determined model output confidence score is below the predetermined threshold, adjust one or more system parameters of the overlay metrology sub-system; and direct the overlay metrology sub-system to capture one or more additional acquisition images.

21. The system of claim 11, wherein the overlay metrology sub-system comprises an image-based overlay metrology sub-system.

22. A method comprising:

receiving one or more acquisition images of a sample from an overlay metrology sub-system;

determining, using a machine learning-based centering model, one or more stage correctables based on the received one or more acquisition images;

determining, using the machine learning-based centering model, a model output confidence score, wherein the model output confidence score indicates a level of confidence associated with a respective stage correctable determined using the machine learning-based centering model;

generating one or more control signals configured to cause a sample stage of the overlay metrology sub-system to adjust a stage position based on the determined one or more stage correctables;

receiving one or more measurement images of the sample from the overlay metrology sub-system, wherein the one or more measurement images are acquired by the overlay metrology sub-system based on the adjusted stage position of the sample stage; and determining one or more overlay measurements based on the received one or more measurement images.

* * * * *